United States Patent [19]

Asch et al.

[11] Patent Number: 4,520,314
[45] Date of Patent: May 28, 1985

[54] PROBE HEAD ARRANGEMENT FOR CONDUCTOR LINE TESTING WITH AT LEAST ONE PROBE HEAD COMPRISING A PLURALITY OF RESILIENT CONTACTS

[75] Inventors: Karl Asch, Guelstein; Johann Greschner, Pliezhausen; Michael Kallmeyer; Werner Kulcke, both of Boeblingen, all of Fed. Rep. of Germany

[73] Assignee: International Business Machines Corporation, Armonk, N.Y.

[21] Appl. No.: 433,341

[22] Filed: Oct. 8, 1982

[30] Foreign Application Priority Data

Oct. 30, 1981 [EP] European Pat. Off. ........ 81109373.1

[51] Int. Cl.³ .................... G01R 1/06; G01R 31/02
[52] U.S. Cl. ................. 324/158 P; 324/72.5; 324/158 F
[58] Field of Search .......... 324/158 P, 158 F, 73 PC, 324/72.5, 149; 339/DIG. 3; 156/643, 647; 73/777; 30/DIG. 13

[56] References Cited

U.S. PATENT DOCUMENTS

| 3,963,985 | 6/1976 | Geldermans | 324/158 P X |
| 4,063,172 | 12/1977 | Faure et al. | 324/158 P |
| 4,177,425 | 12/1979 | Lenz | 324/72.5 X |
| 4,182,937 | 1/1980 | Greenwood | 73/777 X |

Primary Examiner—Ernest F. Karlsen
Assistant Examiner—Stephen M. Baker
Attorney, Agent, or Firm—Robert E. Sandt

[57] ABSTRACT

A probe head arrangement for contacting a plurality of closely adjacent conductor lines 2 comprises a minimum of one probe head 3, where a plurality of fingers 4 together with a back 5 are made in one piece of monocrystalline silicon in semiconductor technique. A plurality of such probe heads 3 are composed to form a tester. At the beginning of each test it is determined which fingers 4 are to be, and are not to be placed onto the individual conductor lines 2 of a card 1 to be tested. Subsequently, the short and interruption tests can be implemented after the correlation of finger and probe head addresses with the conductor line addresses.

11 Claims, 11 Drawing Figures

PROBE HEAD ARRANGEMENT FOR CONDUCTOR LINE TESTING WITH AT LEAST ONE PROBE HEAD COMPRISING A PLURALITY OF RESILIENT CONTACTS

DESCRIPTION

1. Field of Invention

The invention relates to a test apparatus including a probe head arrangement for contacting a plurality of closely adjacent narrow conductor lines or contact pads, and for detecting shorts and interruptions, with at least one probe head comprising a plurality of resilient contacts.

2. Background Information

Owing to the signal delays, the continuously increasing computer switching speeds demand conductor lines of continuously decreasing length for a connection between the individual circuits. There consequently follows the increasing miniaturization and densification of the circuitry. Semiconductor circuits are now mounted on ceramic modules sintered together out of more than 20 layers with more than 10,000 conductor lines. There is the same development in the next higher wiring stage, i.e. the so-called cards or boards, respectively. These cards also consist of a lamination of several resin layers each of which may comprise approximately 10,000 conductor lines.

Modules and cards are therefore a very complicated structure, and after their completion they represent a considerable value. Since a defect in the conductor lines in one layer can irreparably destroy the function of these components, each individual layer must be tested prior to lamination, and any defects found in the conductor lines must be repaired. The thus-found defects can be breaks in the conductor lines, or shorts between the conductors. Basically, each conductor must be tested against every other conductor, which with 10,000 conductors results in approximately $0.5 \times 10^8$ pass or insulation tests, respectively.

The number of tests required can be considerably reduced if all or at least a large part of the conductor lines can be contacted simultaneously, because then the insulation test of a conductor line against all other jointly shorted conductor lines can be performed. In that case, the test involves e.g. only 10,000 insulation tests and 10,000 pass tests.

It is known in the prior art e.g. German Pat. No. 25 59 004 to contact all conductor lines or contact pads simultaneously in order to carry out the necessary functional tests. According to this known arrangement, a plurality of different probe heads with different, and with the same probe contact patterns are known which are releasably provided on a carrier plate. For the test, the carrier plate with the head configuration is lowered onto a large circuit part. The probe heads are connected via different buses to a computer to carry out the programmed test routines. The contact pads of the probe heads consist of the resilient contacts lowered vertically onto the contact pads and conductor lines of the card to be tested. They are composed of several parts and arranged in a pattern in the probe head which precisely corresponds to the conductor line pattern or the pattern of the contact pads to be tested. The thus resiliently arranged contact pads of the probe head depend in their pattern on the pattern to be tested.

For safely contacting a plurality of closely adjacent conductor stripes it is known from East German Pat. No. 77 527 to provide spring wires at an acute angle on the contact stripes, the spring wires being laterally guided combwise to avoid deviations. Here, too, each individual contact stripe has a corresponding associated spring wire with a fixed position. The entire arrangement is not a test unit. DE-OS No. 23 59 149 describes an arrangement for testing electrical contacts provided on ceramic substrates and interconnected via printed conductor lines. The arrangement comprises a contact grid consisting of two conductor patterns on a printed circuit card which are arranged comb-like facing each other, and which intermesh. The distance between two adjacent conductors belonging to different comb-like conductor lines is smaller than the radius of the contact to be contacted which is of a pin form. These contacted contacts thus connect the respective two parts of the conductor pattern so that two branches of a bridge circuit are interconnected. Via one branch of the bridge, current is directed to the contact, and the other branch of the bridge is used for measuring the resistance of the contact to be tested. Such an arrangement cannot be used for testing a very high number of conductor lines and contact pads for interruptions and shorts.

SUMMARY OF THE INVENTION

An object of the invention is to provide a probe head arrangement with a probe head wherein complicated resilient contacts composed of many individual parts are avoided, where the fixed relation with respect to the pattern of the conductor line or contact pad, respectively, is overcome, which permits a speedy testing of the unit to be tested, and that is made relatively easily by means of proven and well-known techniques.

The advantages of the invention substantially consist in that the contacts of the probe head are one-piece fingers which have no fixed position relative to the conductor lines, and which are made of silicon. It is furthermore not necessary to align the fingers precisely onto the conductor line pattern; a guiding of the fingers is not required owing to the material used, and they can be made in accordance with proven techniques. An essential advantage of probe head arrangement according to the invention consists in that it is the basis for a very flexible arrangement for testing differently shaped test objects.

DESCRIPTION OF DRAWINGS

In the following, structure and operation of the invention will be described in detail with reference to the drawings which merely represent an embodiment. The drawings show the following.

DETAILED DESCRIPTION OF THE INVENTION

Figure 1:
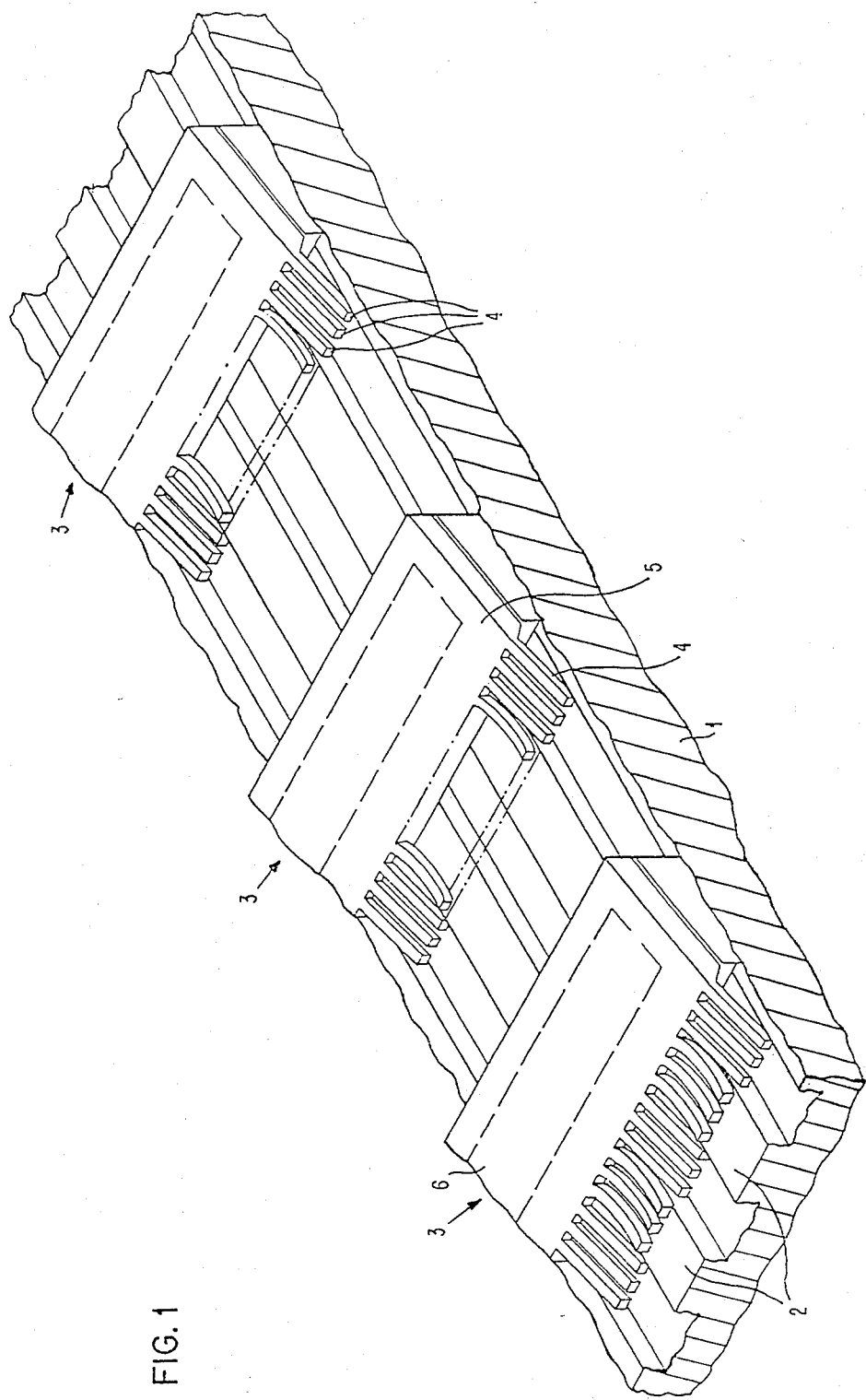
FIG. 1 is a perspective and schematic representation, sectionally the probe head arrangement according to the invention, with several probe heads over a card to be tested.

FIG. 1 shows the section of a card 1 to be tested which is equipped with parallel conductor lines 2. These conductor lines 2 are to be tested for shorts between the conductor lines, and/or interruptions of the conductor lines. For that test, several probe heads 3 of the probe head arrangement designed in accordance with the invention are provided which are arranged transversely to conductor lines 2, and contact the latter. Each probe head 3 comprises a plurality of fingers 4 which are connected with back 5 in comb-fashion. Back 5 can also comprise electric circuit 6 represented in a dashed line in FIG. 1.

Figure 2:
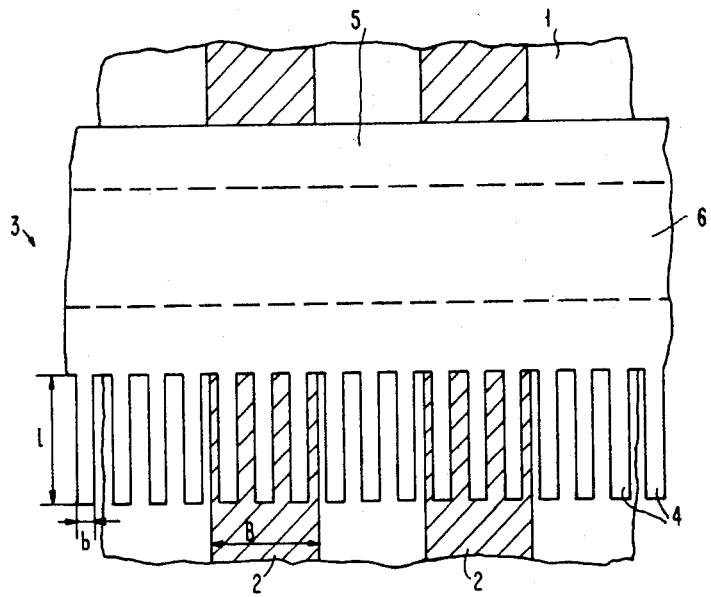
FIG. 2 is a plan view of a section of a probe head arranged over a card.

FIG. 2 is a plan view of a section of the card to be tested with its conductor lines 2 over which, also sectionally, a probe head 3 is provided with its fingers 4, back 5, and in a dashed line the also integrated circuit 6. In the given example, fingers 4 have a length 1 and a width b. Width b of conductors 2 corresponds in that example to the distance between two conductors. In the given example, finger width b and the distance between two adjacent fingers is the same, and generally of such a size that on one conductor- line-width b three fingers always contact one conductor line, irrespective of the position, and three fingers are in the space between two conductor lines 2.

Figure 3:
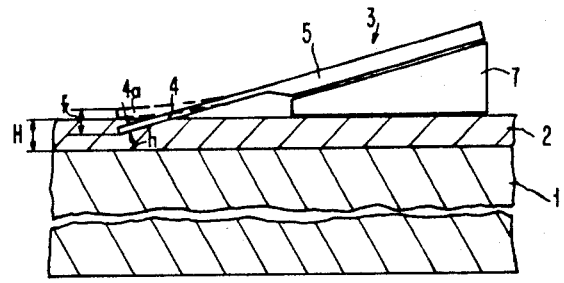
FIG. 3 is a lateral view of a probe head in accordance with the invention over a card.

As shown in FIG. 1, conductor lines 2 are raised over the surface of the interposed parts of card 1. This corresponds to conductor line height h in FIG. 3. This FIG. 3 shows in a lateral view the inclined arrangement of a probe head 3 relative to a sectionally represented conductor line 2 of a card 1 to be tested. One finger 4 is shown in an undeflected position. This finger 4 corresponds to those fingers which according to FIG. 2 are between two conductor lines 2. The finger which is shown in a dashed line and marked 4a is one of those which are placed onto conductor lines 2 and which are deflected by the applied pressure. In the given example, this deflection is f. Fingers 4 are formed in one piece with comb 5, and inclined toward card 1. To ensure this inclined position, and furthermore to fix a maximum limit for this bend f, probe head 3 is arranged with its back 5 on a cone 7 owing to whose geometry, upon the application of probe head 3 onto conductor lines 2 of card 1, the maximum bend $f_{MAX}$ is not exceeded. Cone 7 is made of insulating material.

According to beam theory in a cantilever beam loaded at the end with a force F (equal to a contact pressure of $P=F/b^2$) the deflection f at the end of the beam for the silicon probe head 3 in FIGS. 2 and 3 with dimensions as shown there is:

$$f = \frac{4 \, l^3 \, bP}{E \, h^3}$$

which for the maximum deflection reduces to:

$$f_{MAX} = \frac{2}{3} \, \frac{l^3}{h} \, \frac{k_B}{E}$$

Where:
 f = the deflection (in linear dimension) of the extreme finger end
 l = the length of the fingers
 b = the width of the fingers
 h = the thickness of the fingers
 F = the force applied at the extreme finger end
 $P=F/b^2$ the contact pressure on the conductor line
 E = the modulus of elasticity
 $k_B$ = the admissible stress
 $f_{MAX}$ = the maximum deflection prior to rupture.

To be on the safe side, f should always remain less than $\frac{1}{3} f_{MAX}$.

Under the conditions:

| | |
|---|---|
| conductor line width b | 60 μm |
| finger width b | 10 μm |
| finger thickness h | 10 μm |
| conductor line height h | 50 μm |
| = bend f of the fingers contacting the conductor line contact pressure P of the fingers on the conductor line | 10 N/cm² |
| between the conductor lines | 0 N/cm² |
| modulus of elasticity of silicon | 1.7 × 10⁷ N/cm² |
| admissible stress in bending $k_b$ | 3 × 10⁴ N/cm² | the calculated finger length is l = 1.3 mm.

The maximum deflection prior to rupture is calculated as $f_{MAX}=200$ μm which is more than three times higher than conductor line height h.

Figure 4:
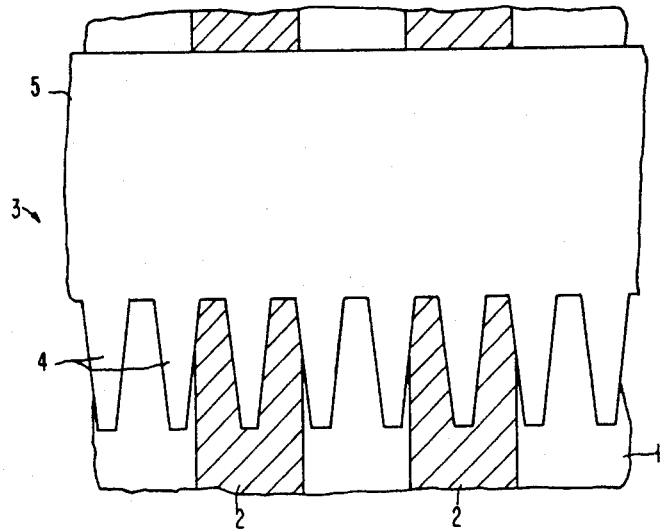
FIG. 4 schematically shows in a plan view a section of a probe head with fingers designed differently from the representation of FIGS. 1 and 2.

In FIG. 4, the section of probe head 3 is shown over the section of a card 1. This probe head 3 comprises fingers 4 which taper in their width from spine 5 toward the finger tip. Further differences between probe head 3 of FIG. 4 and that of FIGS. 2 and 3 consist in that the distance of the finger tips relative to conductor lines 2 is not the same. In the example of FIG. 4, only one respective finger 4 contacts a conductor line 2 therebeneath. The widening of fingers 4 from the tip toward comb 5 increases the break resistance under constant contact pressure, compared with the arrangement according to FIGS. 2 and 3.

The probe head according to the invention with its plurality of fingers with the required fine dimension is preferably made by using microminiature silicon fabrication techniques, as generally described below in connection with FIG. 5. In a silicon substrate 10 corresponding to the necessary length of probe head 3 control logic 20 is placed. This control logic 20 will be described in detail below. It is made, and placed into silicon substrate 10 in accordance with known methods of integrated circuit techniques. Control logic 20 advisably extends in the longitudinal direction of comb 5 over the entire length of the probe head to facilitate a line contact with fingers 4.

By using silicon wafers of commercially available sizes which at present reach 10 cm and more, probe heads of 10 cm and more can be made, corresponding to the size of the base wafer.

Figure 5A:
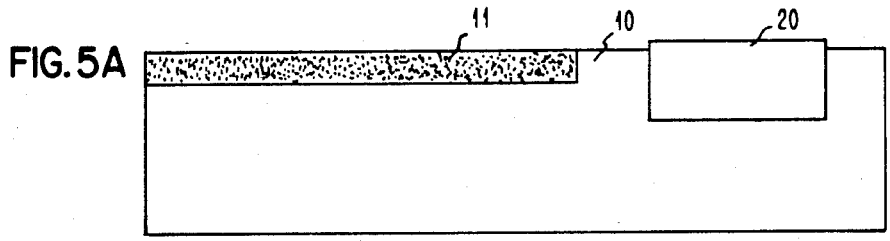
FIGS. 5A–E schematically show different steps in the production of the probe head according to the invention, partly in a lateral view and partly in a plan view.
Figure 5B:
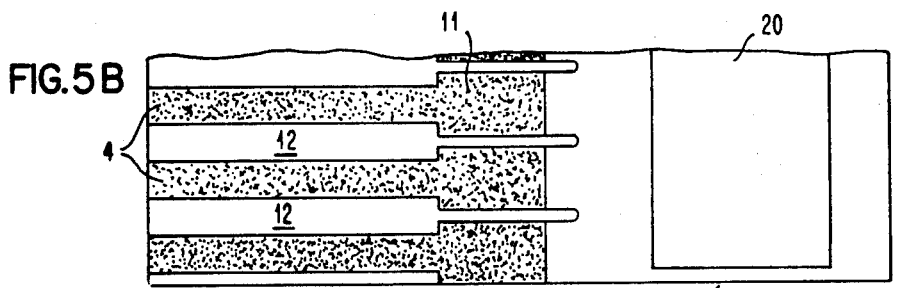

After control logic 20 has been placed into silicon substrate 10, a layer 11 which is provided in the region of fingers 4 and their bases 4', and which is highly doped with approximately 10²⁰ boron atoms/cm³, is produced in comb-region 5. With respect to its depth it exceeds by several μm the future thickness h of fingers 4. This layer 11 is shown in FIG. 5A in a cross-section.

Figure 5C:
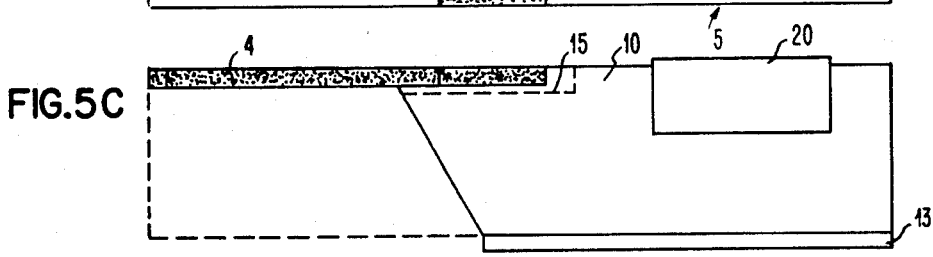
Figure 5D:
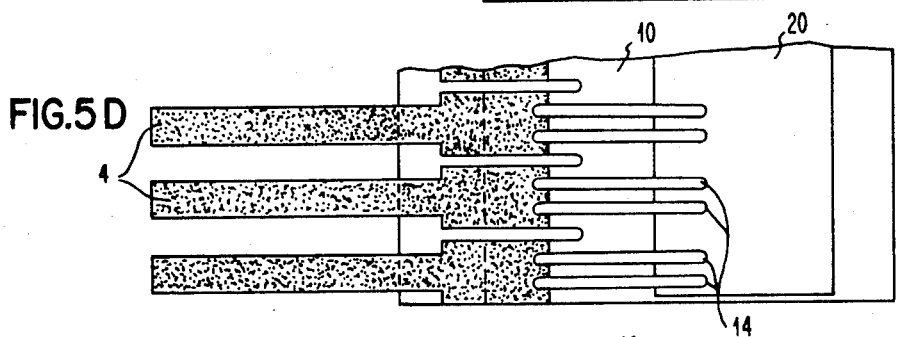
Figure 5E:
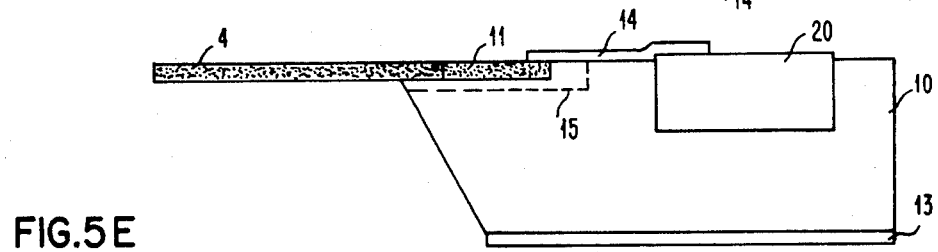

After photolithographic structurization, interspaces 12 between fingers 4 are etched out of highly boron-doped layer 11, an SiO2 layer being used as an intermediate mask. At the same time, interspaces 12 are interrupted depth-wise all through boron-doped layer 11 into the undoped material of silicon substrate 10. This structurization is effected by anisotropic reactive ion etching in an Ar/Cl$_2$-atmosphere. The result is represented in the plan view of FIG. 5B. Then, the back and the lower side, respectively, of silicon substrate 10 is covered with an SiO$_2$-layer 13, and subsequently the free, undoped silicon is etched off down to the highly doped boron layer 11, i.e. down to fingers 4, as shown in FIG. 5C. This is effected through anisotropic, preferential wet etching with ethylenediamine, pyrocatechol and water. The plan view of FIG. 5D shows the result with finished fingers 4 and the slightly enlarged contact pad regions. This figure also shows two respective conductor lines 14 to a finger 4, through which the finger is connected to the circuits of control logic 20. In a cross-section, the finished probe head comb is depicted in FIG. 5E. Dashdotted line 15 also appearing in FIG. 5C represents the region which remains of the highly doped boron layer 11 in the region under the fingers, but it does not bridge the fingers because of the etched interspaces 12.

Owing to the high boron doping of the silicon in regions 11, the electric resistances of fingers 4 are very low. With a boron doping of $10^{20}$ atoms/cm$^3$, the silicon has a resistivity of only $\rho \simeq 10^{-3}$ ohm.cm. For the above given dimensions of the fingers $l=1.3$ mm, $b=10$ μm, $h=10$ μm there results a series resistance of approximately 0.01 Ohm. This resistance is sufficiently low for use. For conductivity reasons therefore no additional metallic coating has to be applied on the fingers. For reasons of elasticity however a metallic coating might be advantageous.

For the electrical test of a card with a multitude of conductor lines and contact pads, respectively, several probe heads 3 are provided in the direction of the conductor lines, as shown in FIG. 1. The conductor lines are contacted via the individual probe heads 3, and tested for pass and/or interruption to other conductor lines. For that purpose, the probe heads are arranged along a path whose width corresponds to the length of the combs, e.g. 10 cm. The distance between the individual probe heads 3 corresponds to the shortest conductor line length or maximum length therebetween on which a defect is to be located. If card 1 to be tested is broader than the dimension corresponding to the length of probe heads 3, several combs, directly or staggered one beside the other, can cover the width of the card.

With reference to the example given in FIG. 6 of the architecture of a tester, electrical test routines and the control logic required for their implementation will be described in detail below.

Figure 6:
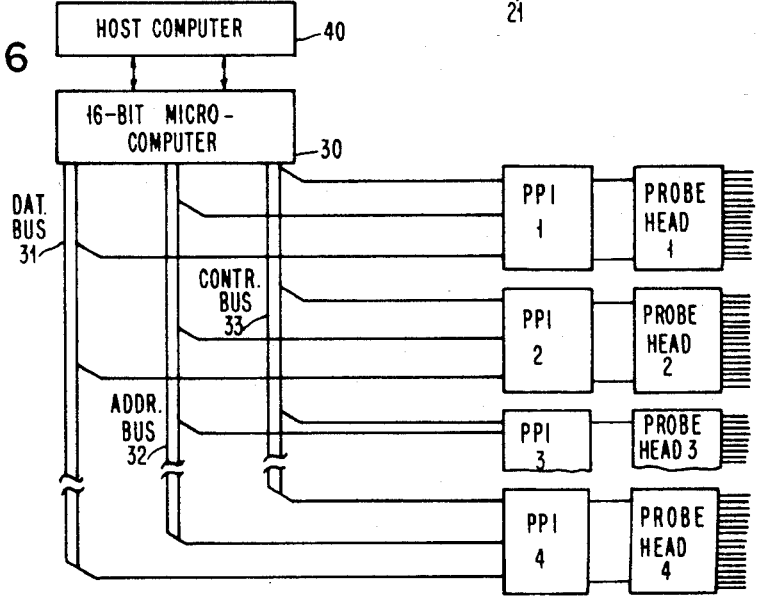
FIG. 6 shows in a block wiring diagram schematically the architecture of a tester composed of a plurality of probe heads in accordance with the probe head arrangement according to the invention.

The tester architecture schematically shown in FIG. 6 comprises e.g. 32 probe heads 1 to 32, each with 2048 fingers and an integrated control logic. The tester furthermore comprises a 16-bit microcomputer 30 connected to a host computer 40. Each probe head is connected via an associated programmable peripheral interface PPI 1 to 32 to a data bus 31, an address bus 32 and a control bus 33. The object of the programmable peripheral interfaces is to adapt the data, address, and control lines of each individual probe head respectively to microcomputer 30.

Figure 7:
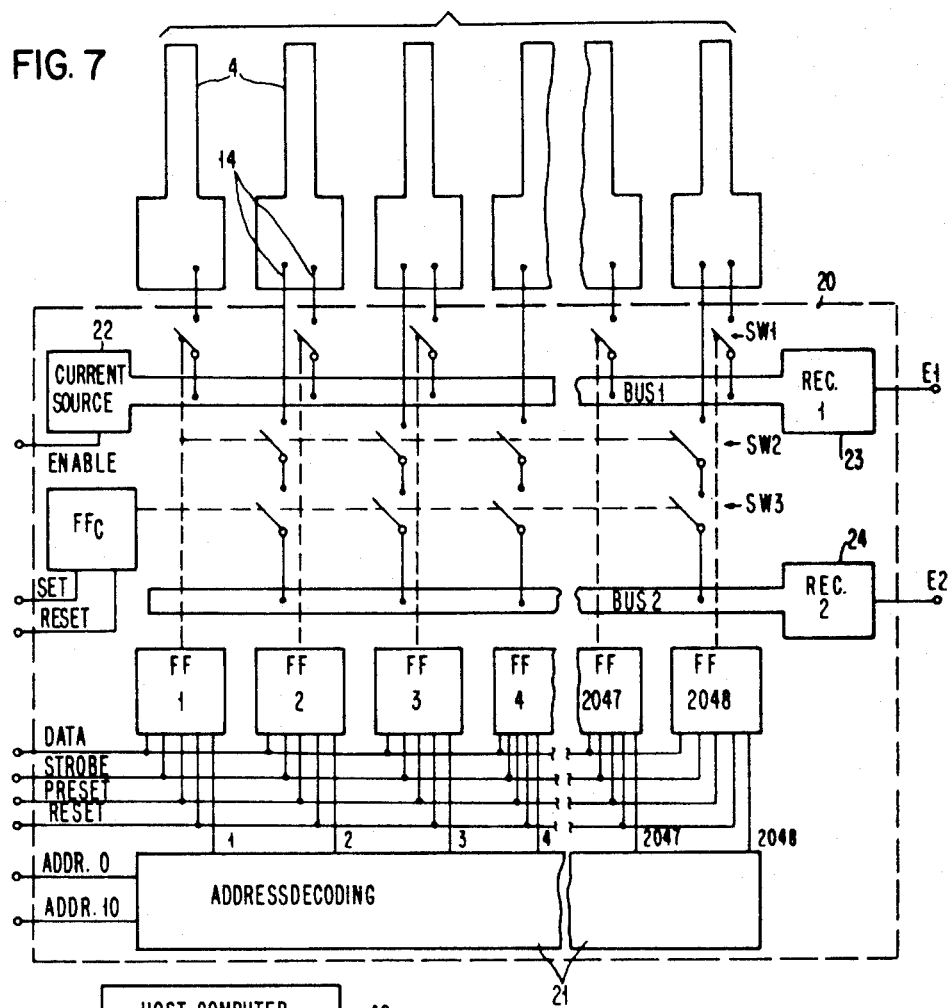
FIG. 7 is a block wiring diagram of the circuits integrated in the probe head.

With reference to the integrated probe logic for a probe head schematically shown in FIG. 7, the individual data, address, and control lines as well as the functional connections will be described below. Circuit logic 20 also integrated in back 5 of each comb is shown in dashed lines and is connected to the individual prongs via lines 14. Control logic 20 comprises address decoding 21 which contains 11 address lines ADR $\phi$ to ADR 10 on the input side and 2048 control lines 1 to 2048 on the output side. Each of these output lines is associated to a memory cell FF$_1$ to FF$_{2048}$ associated to one individual finger 4. The individual memory cells FF$_N$ are furthermore controlled on the input side by a line DATA which is common to all. A logic "1" on this data line sets an addressed memory cell FF$_N$ with the negative slope of a strobe pulse. A logic "$\phi$" on this data line resets the addressed memory cell with the negative slope of the strobe pulse. For this purpose, another line "STROBE" is provided which is applied on the input side to all memory cells and with which data are read on the data line into an addressed memory cell. Another line "PRESET" is provided for the joint setting of all memory cells FF$_1$ to FF$_{2048}$. Via a line "RESET", all memory cells can be reset together. Integrated circuit logic 20 furthermore comprises a memory cell FF$_C$ common to all fingers which is set via a SET line, and reset via a RESET line. Furthermore a current source 22 is provided which is controlled, and switched on and off via an ENABLE line. Current source 22 is connected via a common bus BUS 1, either directly or via predetermined fingers to a first receiver 23 having output line E1 provided at its other side. Another bus BUS 2 is connected to a second receiver 24 having output E1 on its output side. Each individual finger 4 has three associated switches SW1, SW2, and SW3. These switches can be MOS switches. Switches SW1, SW2 and SW3 are controlled by the randomly addressable memory cells FF$_1$ to FF$_{2048}$, or by the common memory FF$_C$, respectively. In that process, switch SW1n of finger n is always switched together with switch SW2 of finger n+1. Via switch SW1, a finger is connected to the common source/receiver BUS1. This is effected for the tests "find conductor line", "short", and "interruption" described below. Via switches SW2 and SW3, the associated fingers are connected to the receiver BUSes2 for the test "find conductor line". Switches SW3 can only be acutated together. Switches SW1 and SW2 are actuated either via the random addressing of the individual memory cells FF$_1$ to FF$_{2048}$, or via their common input line PRESET. By means of a signal on line RESET, switches SW1 and SW2 are all opened together simultaneously via their memory cells.

Apart from the actual supply lines for current source 22, circuit logic 20 therefore requires for the probe head in the given example only 20 connecting lines with 2048 addressable fingers.

In the following, the various tests will be described—first the test "find conductor line" and the "functional test".

In the test "find conductor line", the addresses of the individual fingers on a common conductor line are identified. For that purpose, all switches SW3 are switched off by means of common memory FF$_C$. A signal appears on input line SET. Subsequently, switch SW1$_n$ and thus also switch SW2$_{n+1}$ is shut off through the addressing of memory cell FF$_1$, so that finger 1 is connected to BUS1 and finger 2 to BUS2, i.e., generally finger$_n$ to BUS1, and finger n+1 to BUS2. Then current source 22 is activated through a signal on line ENABLE.

If fingers n and n+1 are on a common conductor line, a signal is received by receiver 24. If the fingers are not on a common conductor line, receiver 24 receives no signal.

This test is implemented with n=1 to n=2047.

The test "functional test" is used for checking integrated circuit logic 20 of a probe head 3. This test is performed like the test "find conductor line", but without placing the probe head itself onto a test object.

If at any time during this test a signal is received at receiver 24 via BUS2, there is a short between the addressed fingers.

The first receiver 23 can be used by means of bus BUS1 for testing current course 22. The signals received originate either from their own current source, or from the current source of another probe head via interspaced conductor lines.

The test "interruption" is used to check the uninterrupted connection of a conductor line from the beginning to the end of the line.

To that effect, all switches SW3 are opened on the corresponding line by means of common memory cell FF$_C$ through signal RESET. Subsequently, switch SW1 of that finger of the probe head is closed which is arranged at the beginning of the respective conductor line. This finger, or these fingers is/are thus connected to BUS1. Then, that switch SW1 of the finger or fingers of that probe head is closed which is arranged at the end of the associated conductor line. In this manner, the corresponding fingers are again connected to the corresponding receiver BUS1. Subsequently, current source 22 of that probe head which is at the beginning of the conductor line is activated. If the conductor line is not interrupted, a signal is received at the first receiver 23 of that probe head which is associated to the conductor line end; otherwise there is no signal.

The data of those fingers and probe heads which are associated to the beginning of a conductor line are generated by host computer 40 through the corresponding data of the associated card to be tested, and by those data which have been detected in the preceding test "find conductor line". The data for the ends of the conductor lines have been generated by host computer 40 from the data of the test object.

The test "short" is to reveal whether one of the conductor lines to be tested is, or is not in contact with another one.

For that purpose, all switches SW3 are opened through a signal on line RESET by means of the common memory cell FF$_C$. Subsequently, that switch SW1 of finger n of that probe head is closed which is arranged at the beginning of the conductor line, so that the latter is connected to the corresponding current source 22 via BUS1. Then all switches SW1 and SW2 of the next probe head over the associated conductor line are closed, and only those switches SW1 and SW2 are opened whose fingers are placed on the conductor line to be tested. Subsequently, that current source 22 of that probe head is activated which is arranged at the beginning of the respective conductor line.

If there is any connection to the other conductor lines under the associated probe heads, a signal is received at the first receiver 23 of the second probe head; if this does not apply there is no signal.

This test is to be executed with all those probe heads which are arranged over a conductor line to be tested.

The data format for the data of host computer 40 is structurized in such a manner that microcomputer 30 receives from host computer 40, and stores the data of the conductor lines of a segment of the cards to be tested. Per probe head, 2049 double words are transferred to microcomputer 30. They represent one data block.

The data per finger amount to 32 bits and are structurized as follows:

Bits 0 to 15 comprise data which are divided into probe head address in bits 0 to 4, and finger address in bits 5 to 15. Bits 16 to 31 contain the conductor line end address, divided again into probe head and finger address.

If the data in bits 0 to 15 and in bits 16 to 32 do not equal 0, this means that the conductor line begins under this probe head and ends at the given conductor line and address. If only in bits 0 to 15 the data do not equal 0 this means that the conductor line begins at a probe head with a lower address, and does not end at this probe head.

From the host computer direct, only the data in bits 0 to 4 and 16 to 20, respectively, are transferred, its own probe head address being redundant as it is already given through the data block.

The data in bits 0 to 4 are 0 if no conductor line is expected under the respective finger.

The data do not equal 0 and represent the next probe head address which is over the same conductor line. This information is necessary for the short test.

If the data in bits 0 to 4 represent their own probe head address, the conductor line ends at that spot.

The data of bits 15 to 20 comprise the probe head address which represents the end of a conductor line. They are used together with the contents of bits 27 to 31 in the interrupt test.

Bits 5 to 15 which represent the finger address are generated in the test "find conductor line", or in the subsequent correlation test, and they are used by the microcomputer.

Bits 21 to 31, finger address or conductor line number, are also transferred by the microcomputer after the correlation test if bits 16 to 20 of the host computer data under the respective finger address equal 0.

Per data block one double word is transferred which in bits 0 to 15 comprises the number of expected conductor lines under the probe head, and in bits 16 to 31 the number of conductor lines beginning under the probe head.

After the tests "find conductor line" and "correlation", the data blocks are completed, and the data per finger can be used as follows:

If bits 5 to 15 do not equal 0, this means that a conductor line has been found under the finger; the data represent the finger address. If bits 0 to 4 do not equal 0, either, and if they do not represent their own probe head address, this conductor line can be relocated at the corresponding probe head under the same finger address or the same conductor line number. If the data correspond to their own probe head address, the conductor line ends in that spot. If bits 16 to 20 do not equal 0, either, the conductor line begins under the probe head that is just being processed, and it ends at that probe head whose address is defined through the contents of bits 16 to 20. If bits 0 to 4 equal 0 this means that although a conductor line had been found under the finger it had not been expected. If bits 5 to 15 equal 0, this means that no conductor line has been found under the prong. If bits 0 to 4 equal 0, too, no conductor line under this finger has been expected, either. If bits 0 to 4 do not equal 0 a conductor line has been expected under this finger but it had not been found.

Microcomputer 30 generates conductor line data during the test "find conductor line", and stores them separately from the data of the host computer. The data width is 8 bits per finger.

If there is a 0 in a data byte, this means that no conductor line has been found under the finger. Data which do not equal 0 mean that a conductor line has been found under the finger. The conductor line data address is identical with the respective finger address.

The conductor line data storage is only 2049 bytes wide, and after the tests "find conductor line" and "correlation" it is overwritten per probe head through the conductor line data of the next probe head in microcomputer 30.

For the data of the host computer the memory size is 4 kword/probe head = 128 kword/segment. For the microcomputer, this amounts to 2 kbyte = 1 kword/segment, one word comprising 16 bits.

The microcomputer data are generated as described above during the "find conductor line" test, beginning at probe head 1. The number of conductor lines found is obtained through the summation of the transitions from 0 to 1.

In the correlation test, the number of conductor lines found is compared with the number of expected conductor lines given through the data of host computer 40. If the two numbers involved are not equal an error indication is made. If the conductor lines found and expected are equal, a correlation operation is carried out to minimize the shifting of the conductive line pattern found relative to that predetermined by the host computer.

Subsequently, if there is sufficient correlation, the finger addresses of the conductor line data equalling 0 in the microcomputer are transferred into the corresponding bits 5 to 15 and 20 to 31.

In the interruption test, the data of the host computer are interrogated, beginning at probe head 1, finger 1, for conductor line starting data 0 and probe head as well as finger address also 0. The associated field for the conductor line end contains the address of that probe head and finger which is the location of the conductor line end.

In the short test, the conductor line starting data are again interrogated for 0. The data in the field for the probe head address, i.e. bits 0 to 4, will then contain the address of the next probe head arranged over the same conductor line. Subsequently, the process is continued as in the interruption test.

For the various tests, the following test times are obtained with a microsecond of average instruction period, and 32 probe heads/segment:

"find conductor lines"
approximately 7 instructions/finger
= 7 × 2048 × 32 × 1 = 460 000 μsec/segment
= 460 msec/segment
"correlation test"
approximately 10 statements/finger
= 10 × 2048 × 32 × 1 = 660 000 μsec/segment
= 660 msec/segment
"interruption test"
approximately 20 statements/finger
= 20 × 1000 × 1 = 20 000 μsec/segment
= 20 msec/segment
"short test"
(1000 conductor lines/segment — medium conductor line length = 10 Pos)

approximately 10 × interruption test = $\frac{200 \text{ msec/segment}}{1340 \text{ msec/segment}}$ These test times show that through the invention the time required for testing a very big and complex card can be limited to a very reasonable extent.

We claim:

1. Apparatus for contacting and testing a plurality of exposed closely spaced electrically conductive members of very small dimensions comprising:
   a monolithic comb-shaped structure consisting of a spine with a plurality of elongated teeth depending therefrom so as to provide a plurality of miniature resilient cantilever beams;
   the said spine and said teeth being fabricated of silicon and the said teeth having been selectively processed so as to have a resistance substantially lower than that of similarly configured teeth of pure silicon.
   solid state integrated circuitry fabricated integral with the said spine portion and connected to each of said teeth and adapted to apply, receive, and test the relativity of potentials on said teeth;
   whereby when the said teeth are applied to said conductors in resilient contact therewith the integrity of the conductors may be determined.

2. The apparatus of claim 1 wherein said teeth are doped with a material chosen from those dopants which substantially reduce the resistivity of silicon.

3. The apparatus of claim 2 wherein the dopant is boron.

4. The apparatus of claim 1 wherein said teeth are coated with an electrical conductive material having a low resistivity.

5. The apparatus of claim 1 wherein said monolithic structure is fabricated of mono-crystalline silicon.

6. In a test apparatus for contacting and testing a plurality of exposed closely spaced electrically conductive members of very small dimensions, the subcombination of a probe head adapted to provide electrical contact with said electrical conductive members, comprising
   a monolithic monocrystalline silicon comb-shaped structure having a spine portion and plurality of elongated teeth depending therefrom to provide a plurality of miniature resilient cantilever beams,
   the said teeth having been selectively processed so as to have a substantially lower resistance than similarly configured teeth of pure silicon, and
   individual electrical connections to each of said teeth for performing electrical testing of any of the electrical conducting members contacted by the said teeth when the probe head is deployed in physical contact with the electrical conductor assembly.

7. The subcombination of claim 6 wherein the said teeth are doped with a material chosen from those dopants which substantially reduce the resistivity of silicon.

8. The subcombination as defined in claim 7 wherein the dopant material is boron.

9. The subcombination of claim 7 wherein the said teeth are coated with an electrical conductive material having a low resistivity.

10. The subcombination of claim 6 wherein the said teeth have a uniform rectangular cross-section.

11. The subcombination of claim 6 wherein the said teeth have a rectangular cross-section decreasing in size from the spine to the ends thereof.

* * * * *